(12) United States Patent
Ko et al.

(10) Patent No.: US 11,417,748 B2
(45) Date of Patent: Aug. 16, 2022

(54) SEMICONDUCTOR DEVICE AND METHOD OF FABRICATING A SEMICONDUCTOR DEVICE

(71) Applicant: Taiwan Semiconductor Manufacturing Co., Ltd., Hsinchu (TW)

(72) Inventors: Chung-Ting Ko, Kaohsiung (TW); Bi-Fen Wu, Taichung (TW); Chi-On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/735,660

(22) Filed: Jan. 6, 2020

(65) Prior Publication Data

US 2021/0134971 A1    May 6, 2021

Related U.S. Application Data

(60) Provisional application No. 62/927,700, filed on Oct. 30, 2019.

(51) Int. Cl.
| | |
|---|---|
| *H01L 29/49* | (2006.01) |
| *H01L 21/28* | (2006.01) |
| *H01L 21/3215* | (2006.01) |
| *H01L 21/8234* | (2006.01) |
| *H01L 27/088* | (2006.01) |

(52) U.S. Cl.
CPC .... *H01L 29/4966* (2013.01); *H01L 21/28088* (2013.01); *H01L 21/3215* (2013.01); *H01L 21/82345* (2013.01); *H01L 21/823431* (2013.01); *H01L 27/0886* (2013.01)

(58) Field of Classification Search
CPC .......... H01L 29/4966; H01L 21/28088; H01L 21/3215; H01L 21/823431; H01L 21/82345; H01L 27/0886
See application file for complete search history.

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 2015/0221743 | A1* | 8/2015 | Ho ................ H01L 21/28088 257/392 |
| 2016/0372565 | A1* | 12/2016 | Huang ............. H01L 27/0924 |
| 2017/0154954 | A1* | 6/2017 | Lin ................. H01L 29/66795 |
| 2018/0019242 | A1* | 1/2018 | Liao ................ H01L 29/517 |
| 2019/0311953 | A1* | 10/2019 | Cho ................ H01L 29/4966 |

\* cited by examiner

*Primary Examiner* — Christine A Enad
(74) *Attorney, Agent, or Firm* — JCIPRNET

(57) ABSTRACT

A semiconductor device including a gate structure disposed on a substrate is provided. The gate structure includes a work function setting layer and a work function tuning layer sequentially disposed on substrate. The work function tuning layer is in contact with an interface surface positioned between the work function setting layer and the work function tuning layer, and a material of the interface surface is different from the work function setting layer.

20 Claims, 13 Drawing Sheets

SEMICONDUCTOR DEVICE AND METHOD OF FABRICATING A SEMICONDUCTOR DEVICE

CROSS-REFERENCE TO RELATED APPLICATION

This application claims the priority benefits of U.S. provisional application Ser. No. 62/927,700, filed on Oct. 30, 2019. The entirety of the above-mentioned patent application is hereby incorporated by reference herein and made a part of this specification.

BACKGROUND

A semiconductor device may require multiple components with different device characteristics. For example, the component for computational logic functions may require increased switching speed, and the component for memory storage functions may require decreased power consumption. Generally, the particular threshold voltage chosen for a transistor may depend on the speed or power characteristic desired and thus a field-effect transistor (FET) in a semiconductor device may be designed to have a particular threshold voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
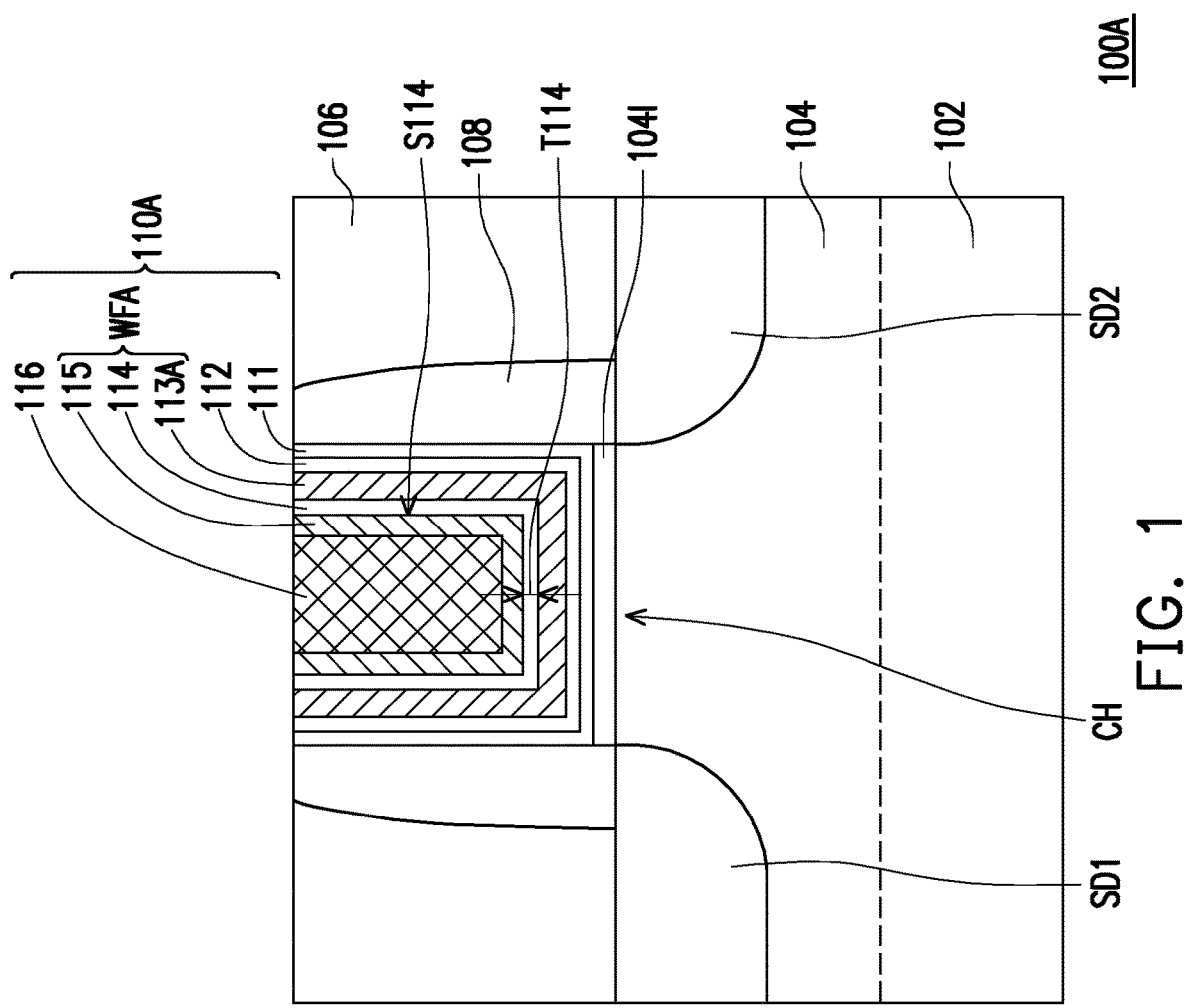
FIG. 1 shows a cross-sectional view of a portion of a semiconductor device according to various exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (a-gate) devices, or Pi-gate (П-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. For example, some embodiments as described herein may also be applied to the formation of contacts, vias, or interconnects.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

FIG. 1 shows a cross-sectional view of a portion of a semiconductor device according to various exemplary embodiments of the disclosure. Specifically, FIG. 1 shows a portion of a transistor such as a FinFET in the semiconductor device 100A that is specific to the exemplary embodiments. In some embodiments, the semiconductor device 100A may be an integrated circuit device typically provided in chip form and may be encapsulated in a package. The semiconductor device 100A may include more than two transistors while one transistor (fin-FET) is illustrated as an example without the intention of limiting the numbers of the transistors in the semiconductor device 100A. In the semiconductor device 100A, thousands, or more, transistors may be interconnected to construct a desired circuit. In accordance with some embodiments, in the semiconductor device 100A, one or more n-type transistor may be interconnected with one or more p-type transistor, for example, by sharing a common gate structure, or may be connected by metal contacts (not shown).

The substrate 102 may be a bulk semiconductor substrate such as a bulk silicon wafer. The term "substrate" may be used to refer to just the semiconductor substrate or a semiconductor substrate inclusive of isolation regions. The substrate 102 may be or include any silicon-containing substrate including, but not limited to, single crystal Si, polycrystalline Si, amorphous Si, or Si-on-insulator (SOI) substrates and the like, and may be n-type or p-type doped as desired for a particular application. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer).

Referring to FIG. 1, the semiconductor device 100A may be formed on a substrate 102 having one or more semiconductor fins 104 that may construct and define a plurality of fin-FETs and in the semiconductor device 100A, an inter-level dielectric layer 106 may be included and positioned between components such as the fin-FETs. In addition, spacers, such as the spacer 108, may be formed on the semiconductor fin 104 and surrounded by the inter-level dielectric layer 106.

The spacer 108 may be made of silicon nitride, SiCN, a combination thereof, or the like, and may include multiple layers. In FIG. 1, a gate structure 110A may be formed and disposed on the semiconductor fin 104. The spacer 108 may define a recess structure on the semiconductor fin 104 and the gate structure 110A may fill the recess so that opposing sides of the gate structure 110A may be covered by the spacer 108. In addition, the semiconductor fin 104 may include a channel region CH that is below the gate structure 110A. A source/drain region SD1 and a source/drain region SD2 are positioned at opposite sides of the channel region CH. Accordingly, the source/drain region SD1 and the source/drain region SD2 may be formed by epitaxial growth, and possibly with implantation, on opposing sides of the gate structure 110A.

In some embodiments, the source/drain region SD1 and the source/drain region SD2 may include p-type dopant material such as boron, aluminum, gallium, indium, or the like, or n-type dopant material such as phosphorus, arsenic, antimony, bismuth, lithium or the like. In some embodiments, lightly doped source/drain (LDD) regions (not shown) may be respectively disposed between the channel region CH and the source/drain region SD1 and between the channel region CH and the source/drain region SD2, while the LDD regions may have a dopant concentration less that the source/drain region SD1 and the source/drain region SD2. In some embodiments, the dopant material of the source/drain region SD1 and the dopant material of the source/drain region SD2 may be different.

In some embodiments, an insulating layer 1041 may be deposited or thermally grown on the semiconductor fin 104 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The insulation layer 1041 may extend at the bottom of the recess structure defined by the spacer 108 and may overlap the spacer 108. In alternative embodiments, the insulation layer 1041 may extend between the spacers 108 without overlapping the spacer 108.

The gate structure 110A may include a high-K dielectric layer 111, a capping layer 112, a work function setting layer 113A, a modifying layer 114, a tuning work function tuning layer 115 and a gate electrode metal layer 116 sequentially deposited in the recess structure defined by the space 108, over the channel region CH and above the insulation layer 1041. Each of the high-K dielectric layer 111, the capping layer 112, the work function setting layer 113A, the modifying layer 114, the tuning work function tuning layer 115 and the gate electrode metal layer 116 may be deposited and/or formed by using physical vapor deposition (PVD), Molecular-Beam Deposition (MBD), atomic layer deposition (ALD), chemical vapor deposition (CVD), sputtering, or other known processes.

The high-K dielectric layer 111 may have a dielectric constant greater than, for example, about 3.9 (the dielectric constant of silicon dioxide) or greater than about 7.0, and be made of, but not limited to, a metal oxide or a silicate of Hf, Al, Zr, La, Mg, Ba, Ti, Pb, and combinations thereof. Alternatively, the high-K dielectric layer 111 may include other high-k dielectrics, such as $HfO_2$, $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

The capping layer 112 may be disposed on the high-K dielectric layer 111 to protect from damages of the high-K dielectric layer 111 during subsequent processing steps. The capping layer 112 may prevent the material diffusion from the overlying layers to the high-K dielectric layer 111 so that the dielectric property of the high-K dielectric layer 111 may be ensured. The material of the capping layer 112 may include nitride, silicon nitride, carbon nitride, and/or aluminum nitride of titanium; a nitride, carbon nitride, and/or carbide of tungsten; the like; or a combination thereof. The high-K dielectric layer 111 and the capping layer 112 may cover the recess structure defined by the spacer 108 over the channel region CH in a conformal manner and form a U-shape structure, but is not limited thereto.

The work function setting layer 113A may be in direct contact with the capping layer 112 and extend along the U-shape structure defined by the capping layer 112. The work function setting layer 113A may also form a U-shape structure. The work function setting layer 113A may be formed of a given work function metal, for example, TiN, TaN, Ru, Mo, Al, WN, other suitable p-type work function materials, or combinations thereof. In alternative embodiments, the work function setting layer 113A may be formed of, for example, Ti, Ag, Al, TiAl, TiAlC, TiAlN, TaC, TaCN, TaSiN, Mn, Zr, NbC, VC, other suitable n-type work function materials, or combinations thereof. In some embodiments, the work function setting layer 113A may include one or more work function material layers.

The modifying layer 114 may cover along the work function setting layer 113A and also form a U-shape structure. In some embodiments, a material of the modifying layer 114 may be an insulation layer that involves insulation property and may have a resistivity greater than $10^8$/ohm·m at the working temperature of the semiconductor device 100A, but not limited thereto. For example, the material of the modifying layer 114 may include metal oxide, metal nitride, metal oxynitride, or a combination thereof. In some embodiments, the material of the modifying layer 114 may include $TiO_x$, $Al_2O_3$, $VO_x$, etc. The modifying layer 114 may be made of inorganic material, but not limited thereto. In some embodiments, a thickness of the modifying layer 114 may be obviously smaller than the work function setting layer 113A. For instance, the thickness of the modifying layer 114 may be greater than OÅ and smaller than 10 Å, for example. The modifying layer 114 having an ultrathin thickness may not provide perceptible insulation property so that the electric conduction between the work function setting layer 113A and the work function tuning layer 115 may still be effective.

The work function tuning layer 115 may be deposited on the modifying layer 114 and form a U-shape structure corresponding to the U-shape structure of the modifying layer 114. The work function tuning layer 115 may be formed of a given work function metal, for example, TiN, TaN, Ru, Mo, Al, WN, other suitable p-type work function materials, or combinations thereof. In alternative embodiments, the work function tuning layer 115 may be formed of a given work function metal, for example, Ti, Ag, Al, TiAl, TiAlC, TiAlN, TaC, TaCN, TaSiN, Mn, Zr, NbC, VC, other suitable n-type work function materials, or combinations thereof. In some embodiments, the material of the work function tuning layer 115 may be different from the material of the work function setting layer 113A. In some embodiments, the work function setting layer 113A may be of p-type work function materials and the work function tuning layer 115 may be of n-type work function materials, but the disclosure is not limited thereto.

The gate electrode metal layer 116 may fill the U-shape structure of the work function tuning layer 115. The gate electrode metal layer 116 may be formed by a gate fill material such as W, TiN, TaN, WN, Re, Ir, Ru, Mo, Al, Cu, Co, Ni, combinations thereof, and/or other suitable compositions. In some embodiments, the high-K dielectric layer 111, the capping layer 112, the work function setting layer 113A, the modifying layer 114, the work function tuning layer 115 and the gate electrode metal layer 116 may have a common top surface for contacting with another conductive material or another component and together construct a gate structure 110A.

In the semiconductor device 100A, the work function setting layer 113A, the modifying layer 114 and the work function tuning layer 115 may together form a work function stack WFA that determine the work function value of the gate structure 110A. A work function value of the gate structure 110A is associated with the material composition of the work function stack WFA, and thus, the work function stack WFA of the gate stack 110A is so chosen that a desired threshold voltage (Vt) of the transistor in the semiconductor device 100A is achieved. In addition, in the work function stack WFA, the modifying layer 114 is an insulation layer with an ultrathin thickness that present different electric property from the work function setting layer 113A and the work function tuning layer 115, so that the work function value of the gate structure 110A may be different from another transistor without the modifying layer 114 to achieve multiple threshold voltage design. In some embodiments, the work function tuning layer 115 may be in contact with the modifying layer 114 at an interface surface S114. The interface surface S114 is a surface that is in direct contact with the work function tuning layer 115 and between the work function setting layer 113A and the work function tuning layer 115. The interface surface S114 may include the same material as the bulk of the modifying layer 114 that is different from the material of the work function setting layer 213A. In some alternative embodiments, the interface surface S114 may include different material from the modifying layer 114. For instance, the interface surface S114 may include a halogen material such as F, Cl, Br, or the like. Accordingly, the interface surface S114 may provide different surface property from the material of the bulk of the modifying layer 114, but the disclosure is not limited thereto.

Figure 2:
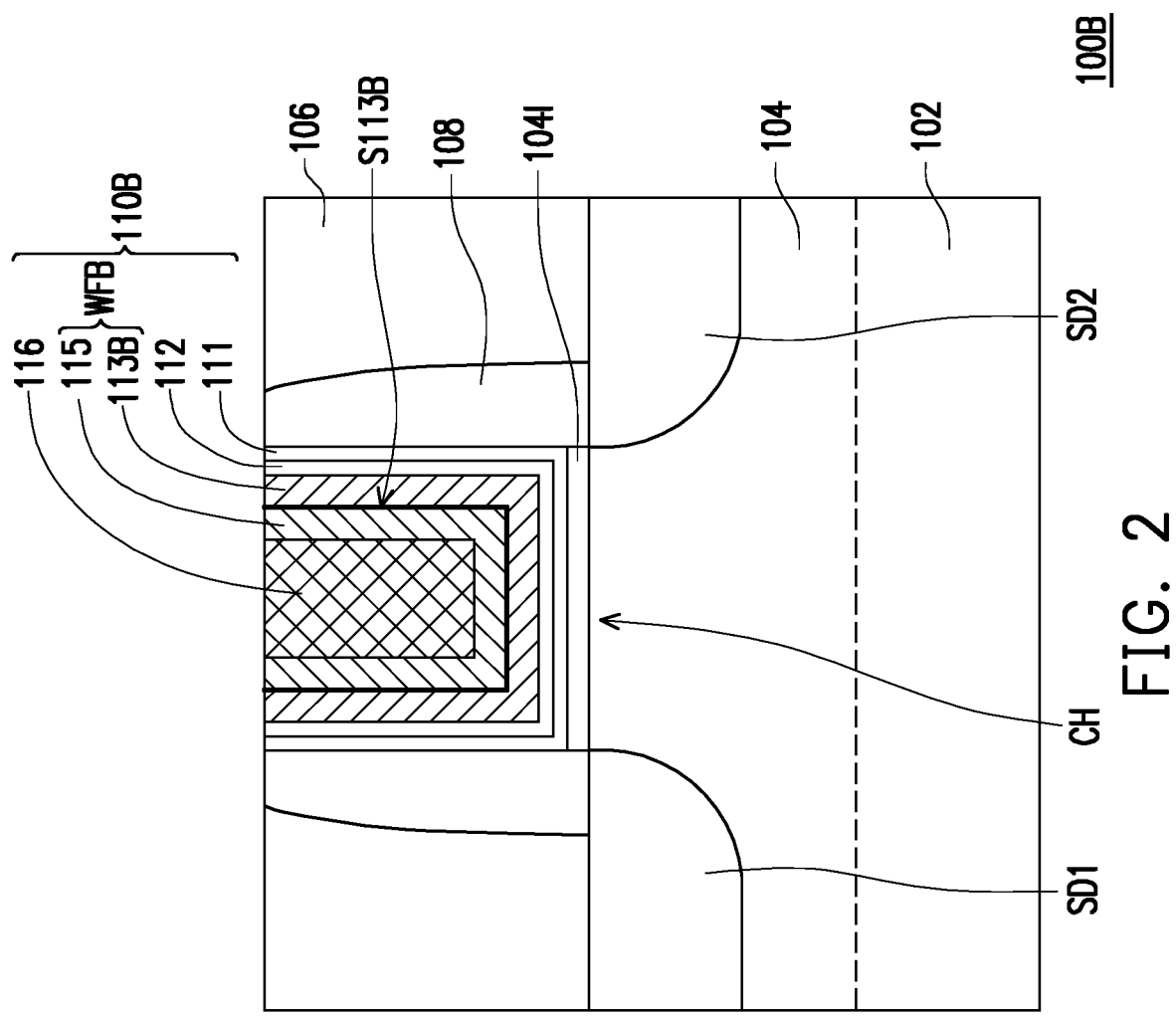
FIG. 2 shows a cross-sectional view of a portion of a semiconductor device according to various exemplary embodiments of the disclosure.

FIG. 2 shows a cross-sectional view of a portion of a semiconductor device according to various exemplary embodiments of the disclosure. FIG. 2 shows a portion of a transistor such as a FinFET in the semiconductor device 100B that is specific to the exemplary embodiments. Similar to the semiconductor device 100A, the semiconductor device 100B may be an integrated circuit device typically provided in chip form and may be encapsulated in a package. Specifically, some layers, components depicted in FIG. 2 may be the same or similar to those described in FIG. 1 and the related paragraphs so that the same and/or similar components and/or layers in the two embodiments may be indicated by using the same reference numbers and the details thereof may refer to the above descriptions and not reiterate herein.

In FIG. 2, the semiconductor device 100B may be formed on the substrate 102 having the semiconductor fin 104. The semiconductor device 100B may include a gate structure 110B disposed on the semiconductor fin 104, the spacer 108 positioned at the opposite sides of the gate structure 110B and the inter-level dielectric layer 106 surrounding the spacer 108. In addition, the semiconductor fin 104 may have the channel region CH below the gate structure 110B. The source/drain region SD1 and the source/drain region SD2 may be formed at opposite sides of the channel region CH. The insulating layer 1041 may be deposited or thermally grown respectively on the semiconductor fin 104 and interposed between the gate structure 110B and the channel region CH of the semiconductor fin 104.

The gate structure 110B may include a high-K dielectric layer 111, a capping layer 112, a work function setting layer 113B, a tuning work function tuning layer 115 and a gate electrode metal layer 116 sequentially deposited in the recess structure defined by the spacer 108, over the channel region CH and above the insulation layer 1041. The high-K dielectric layer 111, the capping layer 112, the work function setting layer 113B, and the tuning work function tuning layer 115 may form a U-shape structure sandwiched by the spacer 108 and the gate electrode metal layer 116 fills the U-shape structure. The materials of the high-K dielectric layer 111, the capping layer 122, the tuning work function tuning layer 115 and the gate electrode metal layer 116 may be selected from the materials as those disclosed in the embodiment of FIG. 1.

The material of the work function setting layer 113B may include a given work function metal, for example, TiN, TaN, Ru, Mo, Al, WN, other suitable p-type work function materials, or combinations thereof. In alternative embodiments, the work function setting layer 113B may be formed of a given work function metal, for example, Ti, Ag, Al, TiAl, TiAlC, TiAlN, TaC, TaCN, TaSiN, Mn, Zr, NbC, VC, other suitable n-type work function materials, or combinations thereof. In the semiconductor device 100B, the work function tuning layer 115 is immediately disposed on the work function setting layer 113B without another layer, such as the modifying layer 114 in FIG. 1, interposed therebetween. The work function tuning layer 115 may be in contact with the work function setting layer 113B at the interface surface S113B to form a work function stack WFB. The resulted work function value of the gate structure 110B as well as the threshold voltage of the transistor 100B may be determined by the work function stack WFB.

In some embodiments, the surface of the work function setting layer 113B adjacent to the work function tuning layer 115 may be treated by a surface treatment to form the interface surface S113B. Specifically, a material of the interface surface S113B may be different from the bulk of the work function setting layer 113B. In some embodiments, the material of the interface surface S113B may include a halogen material such as F, Cl, Br, etc. The interface surface S113B being treated by the halogen material may have a different surface property from not being treated. Accordingly, the deposition of the material of the work function tuning layer 115 on the treated interface surface S113B may be changed when compared to the deposition on a non-treated surface of the work function setting layer 113B. In some instances, the growth rate of the deposited film on the treated interface surface S113B may be slower than that on the non-treated surface. Therefore, different thicknesses of the deposited layers may be formed under the same deposition process. In some embodiments, the difference of the film thickness of the work function material may result in different work function values so that the design the treated interface surface S113B may be applied to the semiconductor device 100B to achieve the multiple threshold voltage design.

Figure 3:
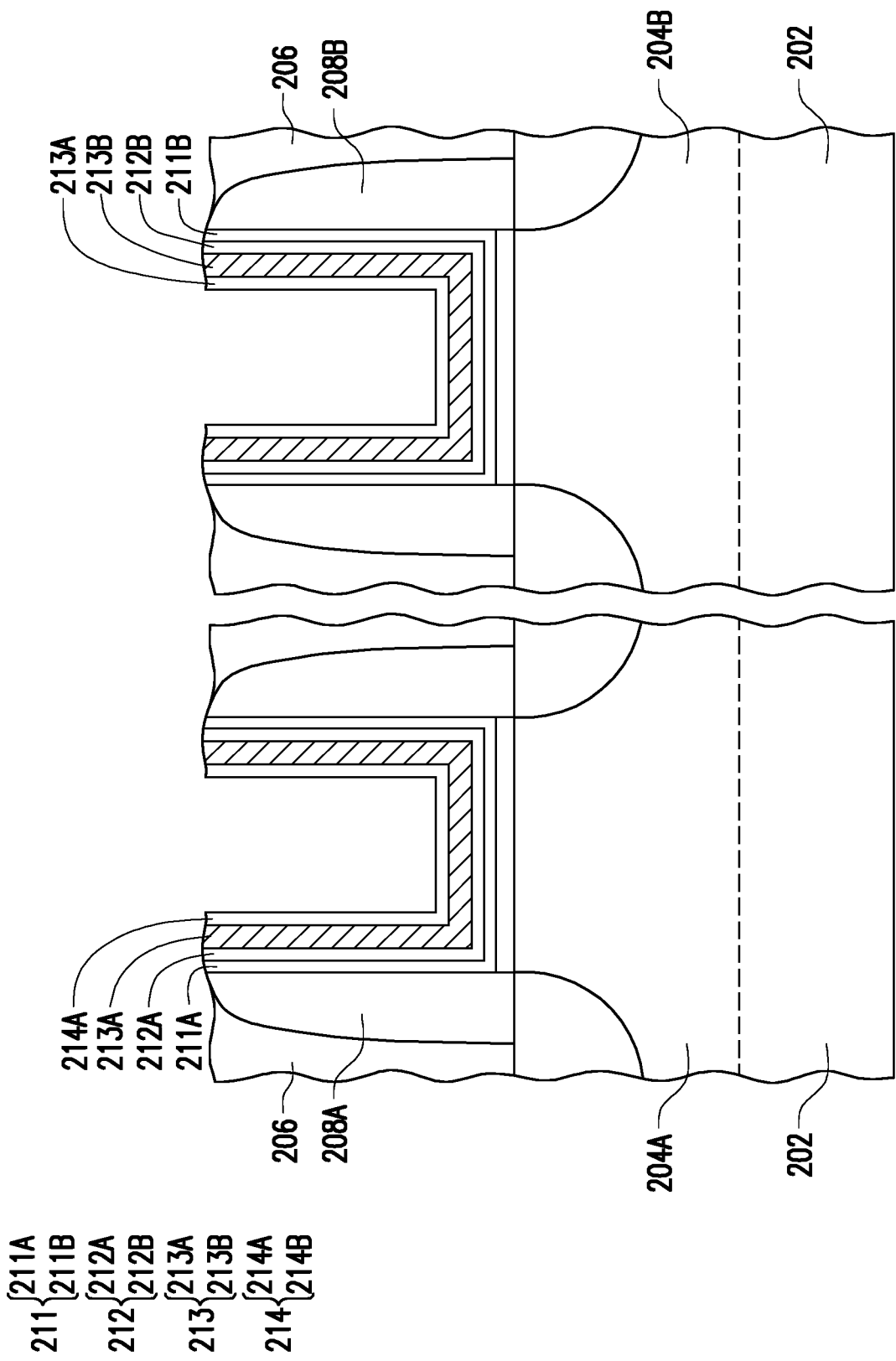
FIG. 3 through FIG. 6 schematically illustrate a fabrication method of a semiconductor device in accordance with same embodiments.

FIG. 3 through FIG. 6 schematically illustrate a fabrication method of a semiconductor device in accordance with same embodiments. An intermediate semi-fabricated device is shown in FIG. 3 and includes a substrate 202 with a semiconductor fin 204A and a semiconductor fin 204B thereon, an inter-level dielectric layer 206 disposed on the substrate 202, and spacers 208A and 208B surrounded by the inter-level dielectric layer 206. The spacer 208A defines a U-shape recess structure over the semiconductor fin 204A and the spacer 208B defines a U-shape recess structure over the semiconductor fin 204B. A high-k dielectric layer 211A, a capping layer 212A, a work function setting layer 213A and a modifying layer 214A may be sequentially deposited on the semiconductor fin 204A and form a U-shape structure in the recess structure defined by the spacer 208A. A high-k dielectric layer 211B, a capping layer 212B, a work function setting layer 213B, and a modifying layer 214B may be sequentially deposited on the semiconductor fin 204B and form a U-shape structure in the recess structure defined by the spacer 208B.

The high-k dielectric layer 211A and the high-k dielectric layer 211B may be formed by a common high-k dielectric layer 211 that is deposited on the substrate by using physical vapor deposition (PVD), Molecular-Beam Deposition (MBD), atomic layer deposition (ALD), chemical vapor deposition (CVD), sputtering, or other known processes. A material of the common high-k dielectric layer 211 may include a metal oxide or a silicate of Hf, Al, Zr, La, Mg, Ba, Ti, Pb, and combinations thereof. The common high-K dielectric layer 212 may have a dielectric constant greater than, for example, about 3.9 (the dielectric constant of silicon dioxide) or greater than about 7.0.

Similarly, the capping layer 212A and the capping layer 212B may be formed by a common capping layer 212 with a material capable of preventing the material diffusion from the overlying layers such as the work function setting layer 213A and the work function setting layer 213B to the high-K dielectric layer 211. The material of the common capping layer 212 may include nitride, silicon nitride, carbon nitride, and/or aluminum nitride of titanium; a nitride, carbon nitride, and/or carbide of tungsten; the like; or a combination thereof. In addition, the common capping layer 212 may have sufficient resistance so that the underlying common high-K dielectric layer 211 may be prevented from damage during the subsequent process.

The work function setting layer 213A and the work function setting layer 213B may be respective parts of a common work function setting layer 213. The common work function setting layer 213 may be made of a given work function metal. For p-type work function, the material of the common work function setting layer 213 may include TiN, TaN, Ru, Mo, Al, WN, other suitable p-type work function materials, or combinations thereof. For n-type work function, the material of the common work function setting layer 213 may include Ti, Ag, Al, TiAl, TiAlC, TiAlN, TaC, TaCN, TaSiN, Mn, Zr, NbC, VC, other suitable n-type work function materials, or combinations thereof. In addition, the common work function setting layer 213 may include multiple work function material layers.

The modifying layer 214A and the modifying layer 214B may be formed by a common modifying layer 214. A material of the common modifying layer 214 may include an insulation material that involves insulation property and may have a resistivity greater than $10^8$/ohm·m. In some embodiments, the material of the common modifying layer 214 may include $TiO_x$, $Al_2O_3$, $VO_x$, etc. The common modifying layer 214 may be formed on the substrate 202 by using an atomic layer deposition (ALD) and the thickness of the common modifying layer 214 may be thinner than the common work function setting layer 213. In some embodiments, the thickness of the modifying layer 214 may be greater than OA and smaller than 10 Å, for example. Accordingly, the common modifying layer 214 though is an insulation layer would not obstruct the electric conduction.

Figure 4:
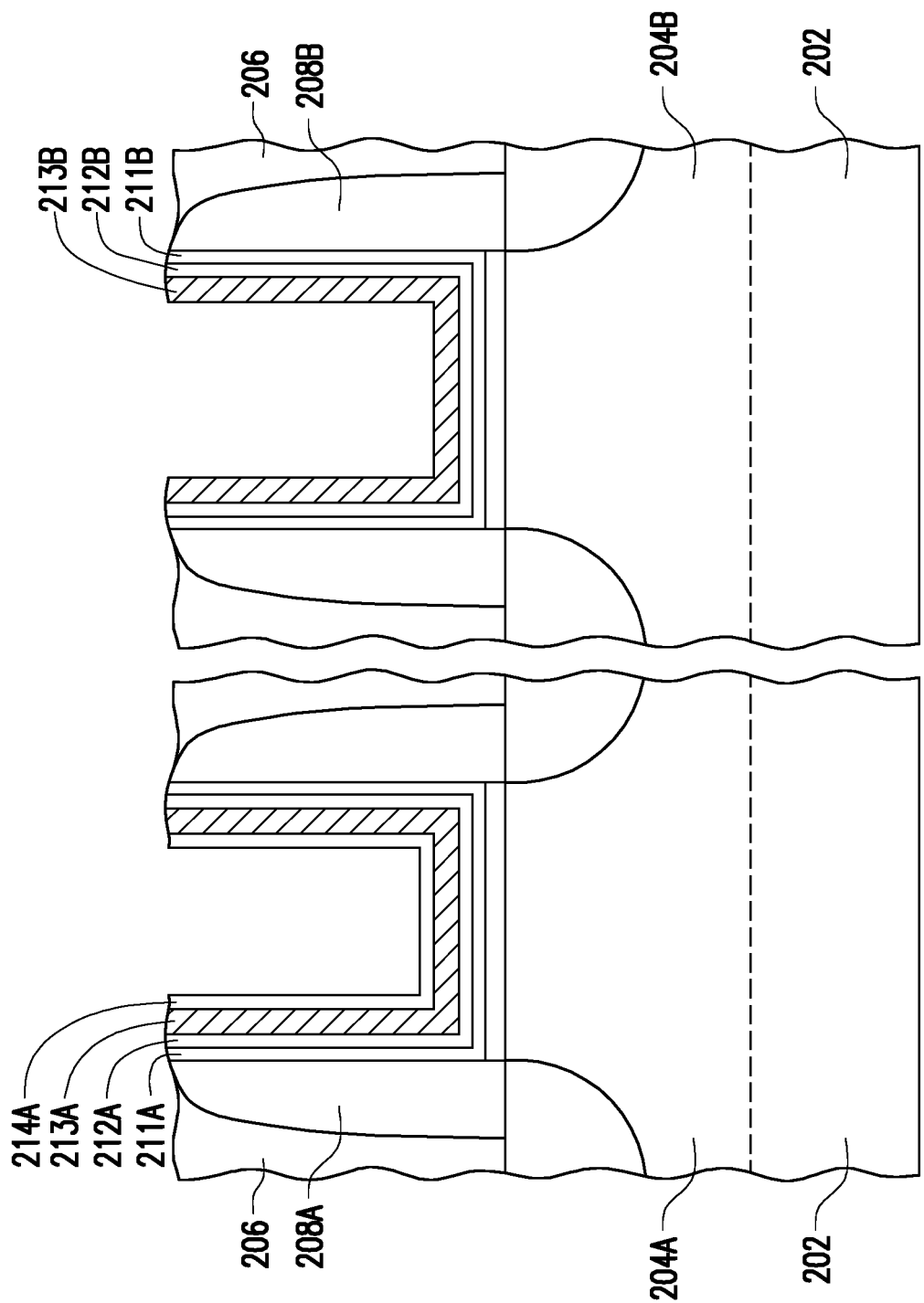

Subsequently, the common modifying layer 214 may be patterned to remove the modifying layer 214B while the modifying layer 214A remains on the work function setting layer 213A as shown in FIG. 4. In some embodiments, the modifying layer 214B may be completely removed so that the work function setting layer 213B may be exposed while the work function setting layer 213A is still covered by the modifying layer 214A. In some embodiments, the removing the modifying layer 214B may include a photolithography and etching process that allows an etchant reaching and be in contact with the modifying layer 214B while the modifying layer 214A is covered by a photoresist until the modifying layer 214B is completely removed. Thereafter, the photoresist is removed to achieve the structure as shown in FIG. 4.

Figure 5:
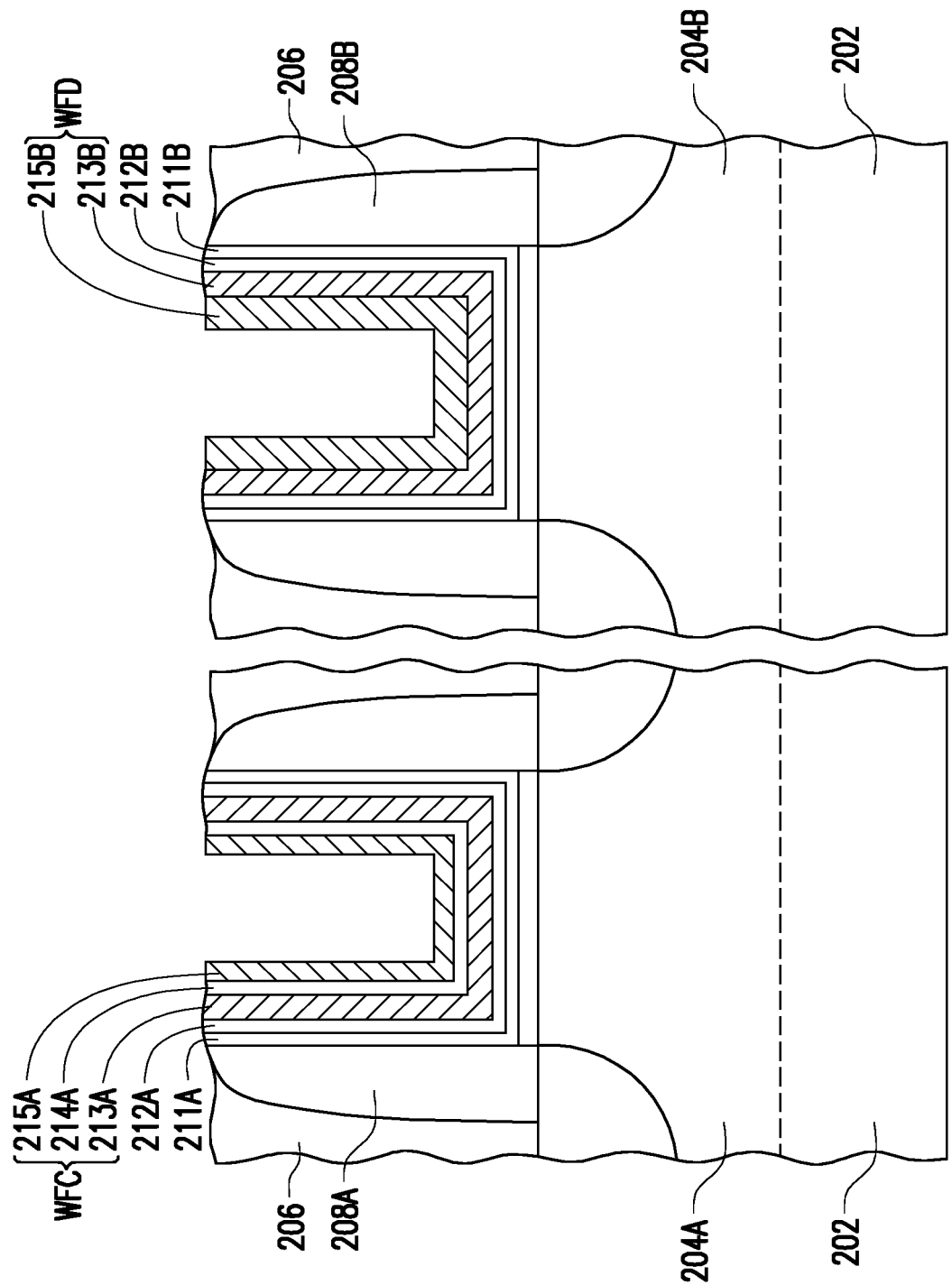

In FIG. 5, a common work function tuning layer 215 is formed on the substrate 202 by using physical vapor deposition (PVD), Molecular-Beam Deposition (MBD), atomic layer deposition (ALD), chemical vapor deposition (CVD), sputtering, or other known processes. The portion of the common work function tuning layer 215 covering the modifying layer 214A is s work function tuning layer 215A and the portion of the common work function tuning layer 215 covering the work function setting layer 213B is a work function tuning layer 215B. A material of the common work function tuning layer 215 may be a given work function metal. For p-type work function, the material of the common work function tuning layer 215 may include TiN, TaN, Ru, Mo, Al, WN, other suitable p-type work function materials, or combinations thereof. For n-type work function, the material of the common work function tuning layer 215 may include Ti, Ag, Al, TiAl, TiAlC, TiAlN, TaC, TaCN, TaSiN, Mn, Zr, NbC, VC, other suitable n-type work function materials, or combinations thereof. In addition, the material of the common work function tuning layer 215 is different from the material of the common work function setting layer 213. In some embodiments, the common work function setting layer 213 may be of p-type work function material and the common work function tuning layer 215 may be of n-type work function material.

Figure 6:
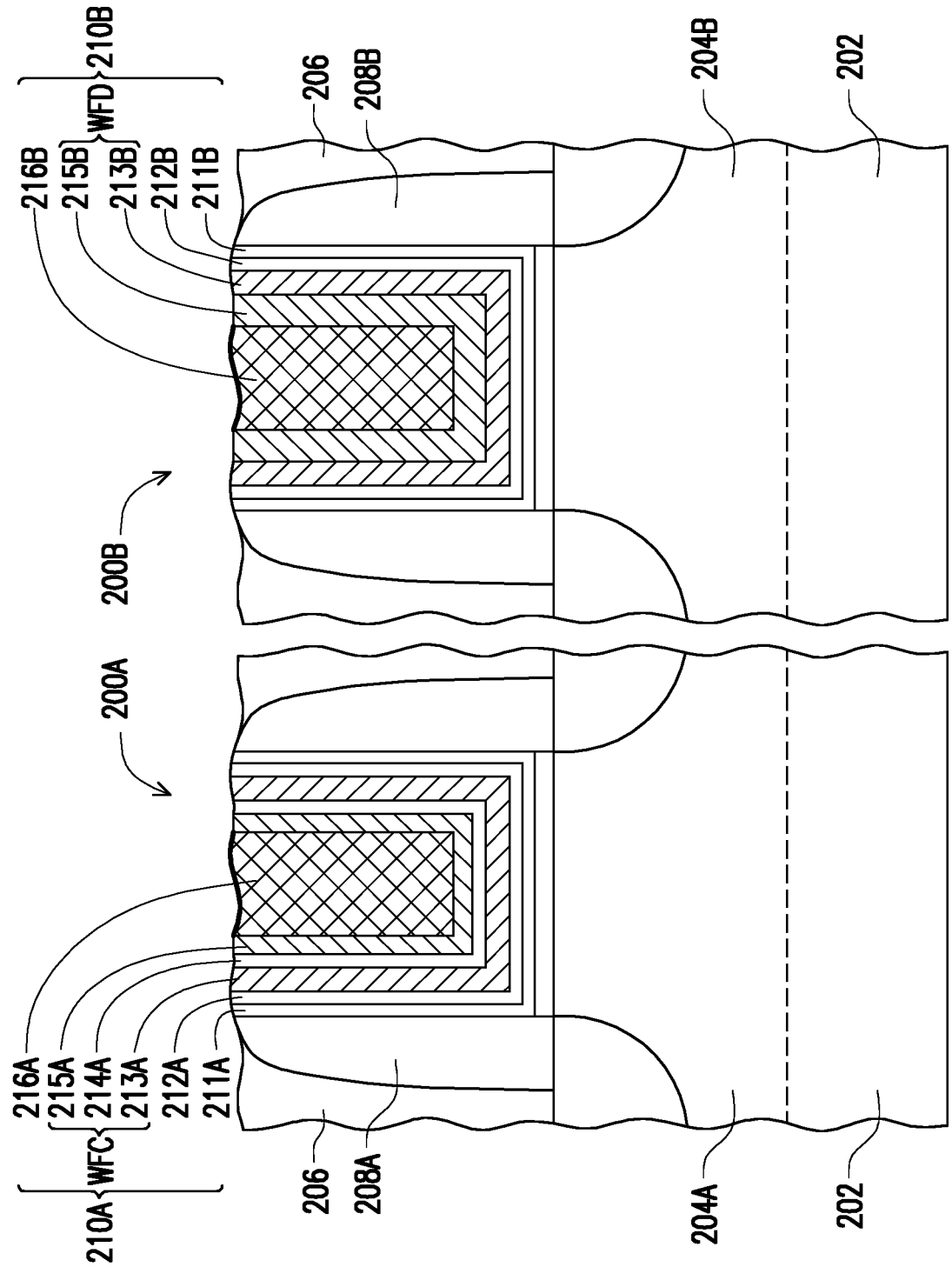

In FIG. 6, a gate fill material is deposited on the substrate 202 to form a gate electrode metal layer 216A and a gate electrode metal layer 216B. The gate fill material may include metal material such as W, TiN, TaN, WN, Re, Ir, Ru, Mo, Al, Cu, Co, Ni, combinations thereof, and/or other suitable compositions. The gate electrode metal layer 216A fills the U-shape structure of the work function tuning layer 215A and the gate electrode metal layer 216B fills the U-shape structure of the work function tuning layer 215B to respectively form a transistor 200A and a transistor 200B of a semiconductor device on the substrate 202.

The transistor 200A may include a gate structure 210A on the semiconductor fin 204A and the transistor 200B may include a gate structure 210B on the semiconductor fin 204B. In some embodiments, the semiconductor fin 204A and the semiconductor fin 204B may be different fin structures on the substrate 202. Alternatively, the semiconductor fin 204A and the semiconductor fin 204B may be different portions of the same fin structure on the substrate 202. The gate structure 210A and the gate structure 210B may have different structures and provide different work function values so that the threshold voltage of the transistor 200A may be different from that of the transistor 200B.

The gate structure 210A includes the high-K dielectric layer 211A, the capping layer 212A, the work function setting layer 213A, the modifying layer 214A, the work function tuning layer 215A and the gate electrode metal layer 216A that are sequentially deposited on the U-shape recess define by the spacer 208A over the semiconductor fin 204A. The work function setting layer 213A, the modifying layer 214A and the work function tuning layer 215A together form a work function stack WFC. The resulted work function value of the gate structure 210A as well as the threshold voltage of the transistor 200A may be determined by the work function stack WFC.

The gate structure 210B includes the high-K dielectric layer 211B, the capping layer 212B, the work function setting layer 213B, the work function tuning layer 215B and the gate electrode metal layer 216B that are sequentially deposited on the U-shape recess define by the spacer 208B over the semiconductor fin 204B. The work function setting layer 213B, and the work function tuning layer 215B together form a work function stack WFD. The resulted work function value of the gate structure 210B as well as the threshold voltage of the transistor 200B may be determined by the work function stack WFD.

The work function stack WFC and the work function stack WFD have different structure and thus the resulted work function value of the gate structure 210A may be different from that of the gate structure 210B. The design of multiple threshold voltages in the semiconductor device may thus be achieved. In the work function stack WFC, the work function tuning layer 215A is in contact with the modifying layer 214A, and the modifying layer 214A is in contact with the work function setting layer 213A. In the work function stack WFD, the work function setting layer 213B is in contact with the work function tuning layer 215B. The work function setting layer 213A and the work function setting layer 213B may be of the same material and substantially the same thickness. Similarly, the work function tuning layer 215A and the work function tuning layer 215B may be of the same material and substantially the same thickness. In some embodiments, the modifying layer 214A is made of an insulation material, but the thickness of the modifying layer 214A may be so thin that the electric conduction between the work function setting layer 213A and the work function tuning layer 215A may not be obstructed. However, the resulted work function value of the work function stack WFE may be influenced by the modifying layer 214A. Accordingly, the resulted work function value of the work function stack WFE may be different from that of the work function stack WFD.

Figure 7:
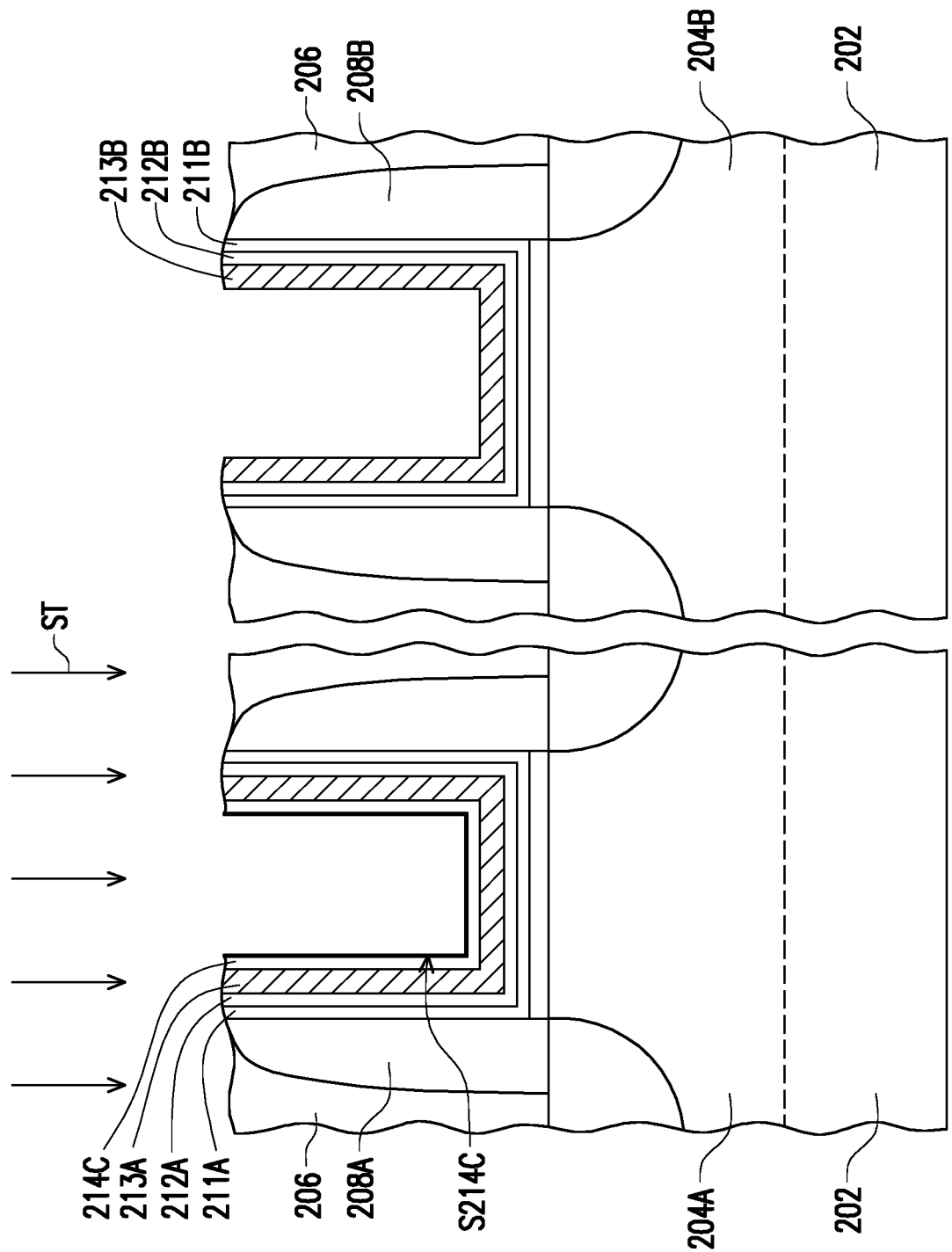
FIG. 7 through FIG. 9 schematically illustrate a fabrication method of a semiconductor device in accordance with same embodiments.
Figure 8:
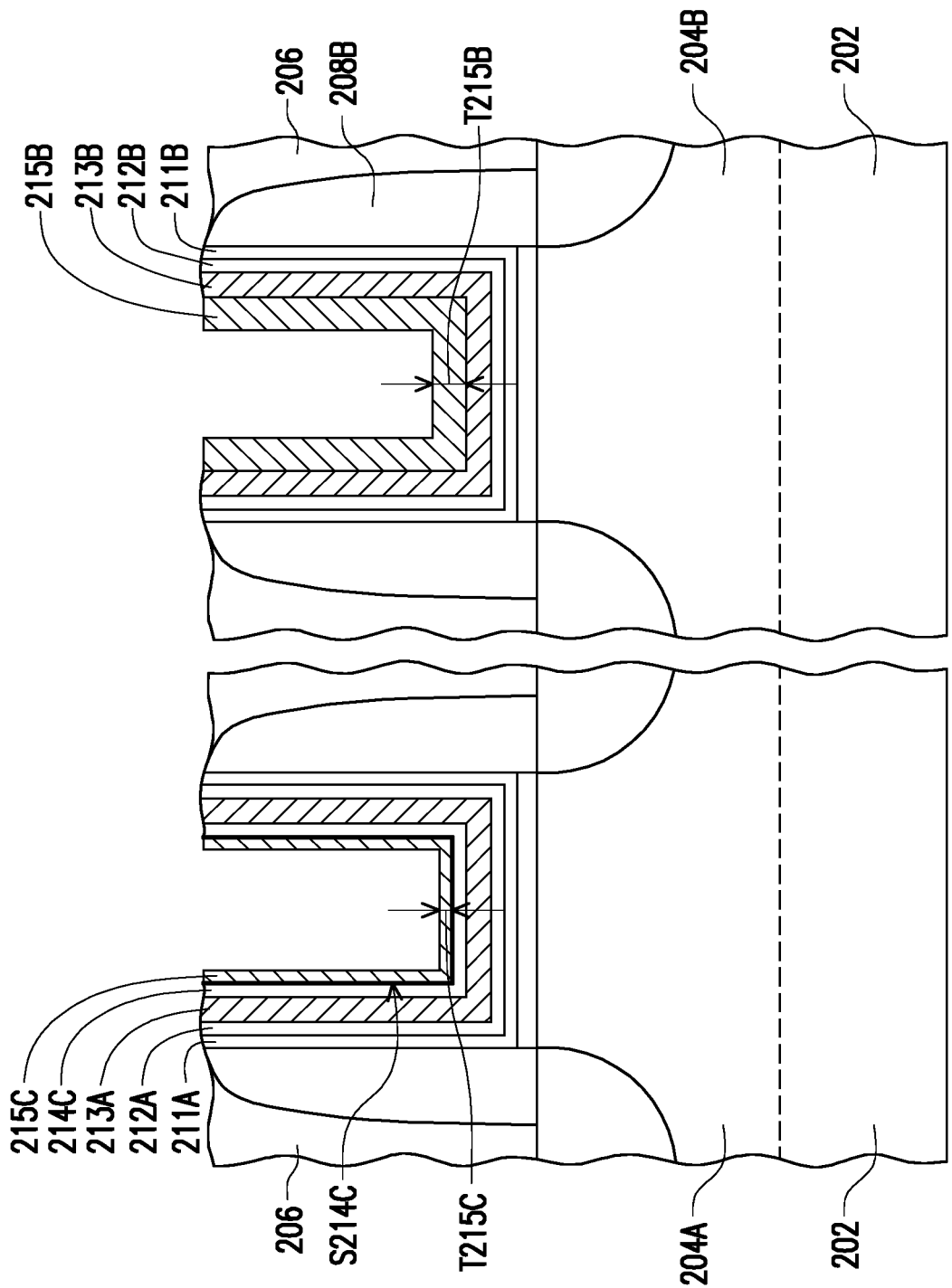
Figure 9:
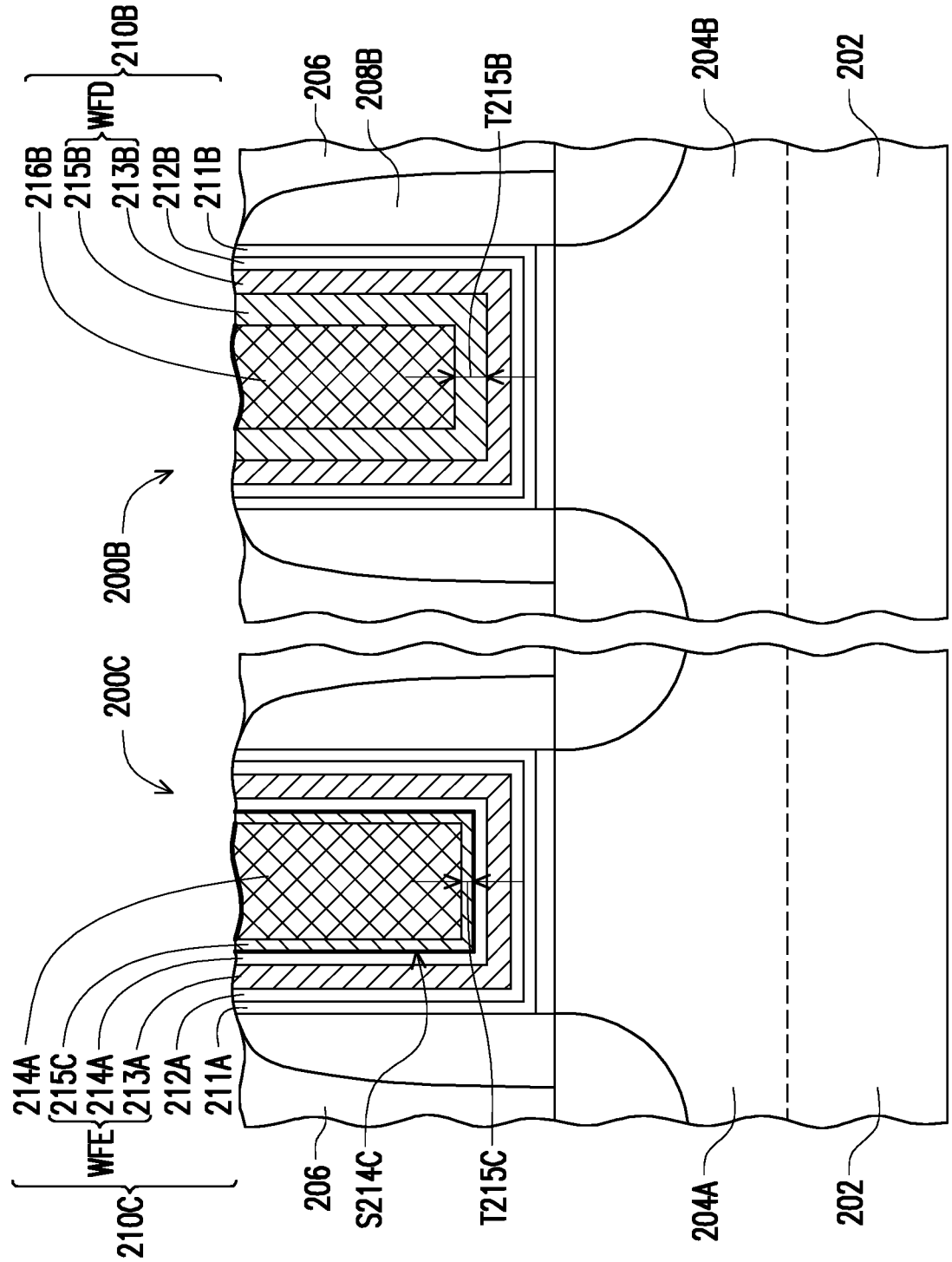

FIG. 7 through FIG. 9 schematically illustrate a fabrication method of a semiconductor device in accordance with same embodiments. In FIG. 7, a substrate 202 with a semiconductor fin 204A and a semiconductor fin 204B thereon, an inter-level dielectric layer 206 disposed on the substrate 202, and spacers 208A and 208B surrounded by the inter-level dielectric layer 206 are shown. The high-K dielectric layer 211A, the capping layer 212A, the work function setting layer 213A, and the modifying layer 214C are sequentially formed on the semiconductor fin 204A. The high-K dielectric layer 211B, the capping layer 212B, and the work function setting layer 213B are sequentially formed on the semiconductor fin 204B.

Referring to FIG. 3 and FIG. 7 together, an intermediate semi-fabricated device shown in FIG. 3 may be provided in advance and a surface treatment ST is performed on the substrate 202 to form the modifying layer 214C from the non-treated modifying layer 214A. In some embodiments, the surface treatment ST may include a plasma treatment and the plasma may include halogen material. Now, the surface of the modifying layer 214C is modified to include a halogen material and forms the interface surface S214C. The interface surface S214C is the surface of the modifying layer 214C but include a material different from the bulk of the modifying layer 214C. For example, the material of the interface surface S214C may include F, Cl, Br or other halogen material. Subsequent to the surface treatment ST, the modifying layer 214B shown in FIG. 3 may be removed to obtain the structure shown in FIG. 7. Over the semiconductor fin 204B, the work function setting layer 213B may be exposed while the work function setting layer 213A is covered by the modifying layer 214C having the treated interface surface S214C.

Referring to FIG. 8, a deposition process of work function material is subsequently performed on the substrate 202 to form a work function tuning layer 215C on the modifying layer 214C and a work function tuning layer 215B on the work function setting layer 213B. The deposition process of work function material may include physical vapor deposition (PVD), Molecular-Beam Deposition (MBD), atomic layer deposition (ALD), chemical vapor deposition (CVD), sputtering, or other known processes. Under the same deposition process, the work function tuning layer 215C and the work function tuning layer 215B are formed. The thickness T215C of the work function tuning layer 215C may be different from the thickness T215B of the work function tuning layer 215B since the work function tuning layer 215C and the work function tuning layer 215B are formed on the surfaces of different material. In some embodiments, the interface surface S214C is treated by halogen material and have different surface property from the surface of the work function setting layer 213B. The growth rate of the work function material on the interface surface S214C may be smaller than that on the surface of the work function tuning layer 215B. As such, the thickness T215C of the work function tuning layer 215C may be smaller than the thickness T215B of the work function tuning layer 215B.

In some alternative embodiments, the surface treatment ST may be performed following the step shown in FIG. 4. In other words, the surface of the modifying layer 214C and the surface of the work function setting layer 213B may both be treated by the plasma including halogen material. However, the affinity of the modifying layer 214C to the halogen material is more significant than the affinity of the work function setting layer 213B. The halogen material may be more enriched on the interface surface S214C of the modifying layer 214C than the surface of the work function setting layer 213B. Accordingly, the work function tuning layer 215C formed on the modifying layer 214C may be thinner than the work function tuning layer 215B formed on the work function tuning layer 215B though the work function tuning layer 215B and the work function tuning layer 215C are made by using the same process condition and the same process time.

Thereafter, the process similar to the step of FIG. 6 is performed to form a gate electrode metal layer 216A on the work function tuning layer 215C and a gate electrode metal layer 216B on the work function tuning layer 215B. As shown in FIG. 9, a transistor 200B and a transistor 200B of a semiconductor device on the substrate 202 may be formed. The transistor 200A may include a gate structure 210C and the transistor 200B may include a gate structure 210B. The gate structure 210C and the gate structure 210B may have different structures and present different work function values so as to be applicable in a multiple threshold voltage design.

The gate structure 210C may include the high-K dielectric layer 211A, the capping layer 212A, the work function setting layer 213A, the modifying layer 214C, the work function tuning layer 215C and the gate electrode metal layer 216A sequentially deposited on the semiconductor fin 204A. The gate structure 210B may include the high-K dielectric layer 211B, the capping layer 212B, the work function setting layer 213B, the work function tuning layer 215B and the gate electrode metal layer 216B sequentially deposited on the semiconductor fin 204B. The work function tuning layer 215B may be immediately deposited on the work function setting layer 213B while the work function setting layer 213A and the work function tuning layer 215C may be interposed by the modifying layer 214C, so that the stack structure of the gate structure 210C is different from that of the gate structure 210B.

The modifying layer 214C may have been subjected to a surface treatment so that an interface surface S214C of the modifying layer 214C in contact with the work function tuning layer 215C may include a material different from the bulk of the modifying layer 214. In some embodiments, the thickness T215C of the work function tuning layer 215C may be smaller than the thickness T215B of the work function tuning layer 215B. The resulted work function value of the gate structure 210C may be different from the resulted work function value of the gate structure 210B; therefore, the threshold voltage of the transistor 200A may be different from the threshold voltage of the transistor 200B so as to achieve a multi Vth design of the semiconductor device.

Figure 10:
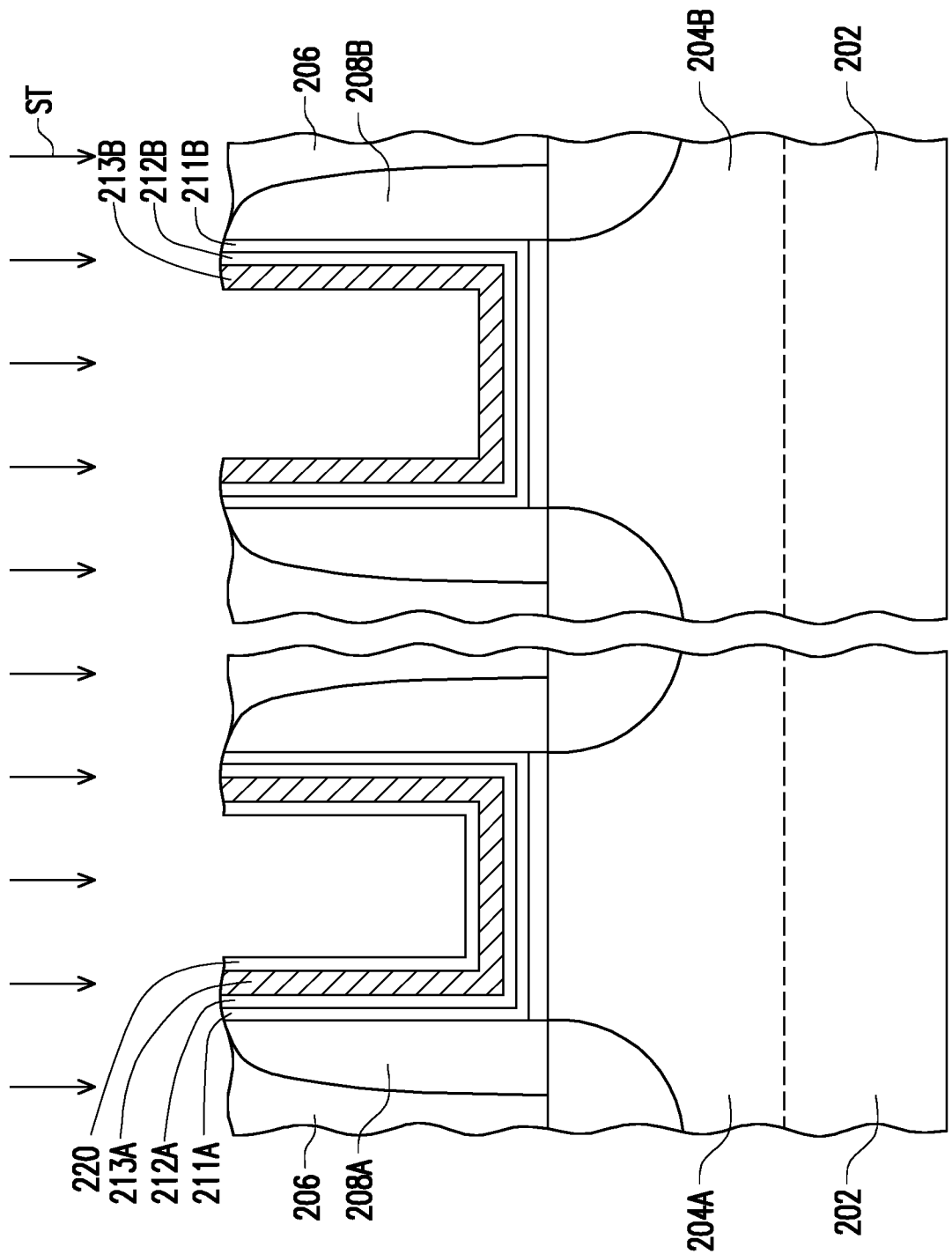
FIG. 10 through FIG. 13 schematically illustrate a fabrication method of a semiconductor device in accordance with same embodiments.

FIG. 10 through FIG. 13 schematically illustrate a fabrication method of a semiconductor device in accordance with same embodiments. An intermediate semi-fabricated device is shown in FIG. 10 and includes a substrate 202 with a semiconductor fin 204A and a semiconductor fin 204B thereon, an inter-level dielectric layer 206 disposed on the substrate 202, and spacers 208A and 208B surrounded by the inter-level dielectric layer 206. The spacers 208A define a U-shape recess structure over the semiconductor fin 204A and the spacers 208B define a U-shape recess structure over the semiconductor fin 204B. Over the semiconductor fin 204A, a high-k dielectric layer 211A, a capping layer 212A, and a work function setting layer 213A may be sequentially deposited on the substrate 202 and form a U-shape structure in the recess structure of the spacers 208A. Over the semiconductor fin 204B, a high-k dielectric layer 211B, a capping layer 212B, and a work function setting layer 213B may be sequentially deposited on the substrate 202 and form a U-shape structure in the recess structure of the spacer 208B. In addition, a hard mask layer 220 is further formed on the work function setting layer 213A and the hard mask layer 220 may be an insulation layer capable of shielding a desired region. The details of the high-K dielectric layers 211A and 211B, the capping layers 212A and 212B, the work function setting layers 213A and 213B may refer to the previous descriptions and no reiterate here.

In FIG. 10, a surface treatment ST may be performed on the substrate 202. The surface treatment ST may include a plasma treatment and the plasma may include halogen material, but the disclosure is not limited thereto. The work function setting layer 213A is covered by the hard mask layer 220 so that the work function setting layer 213A may not be subjected to the surface treatment ST. The work function setting layer 213B may be subjected to the surface treatment ST so that halogen material in the plasma may attach or be deposited onto the surface of the work function setting layer 213B and also the surface of the hard mask layer 220.

Figure 11:
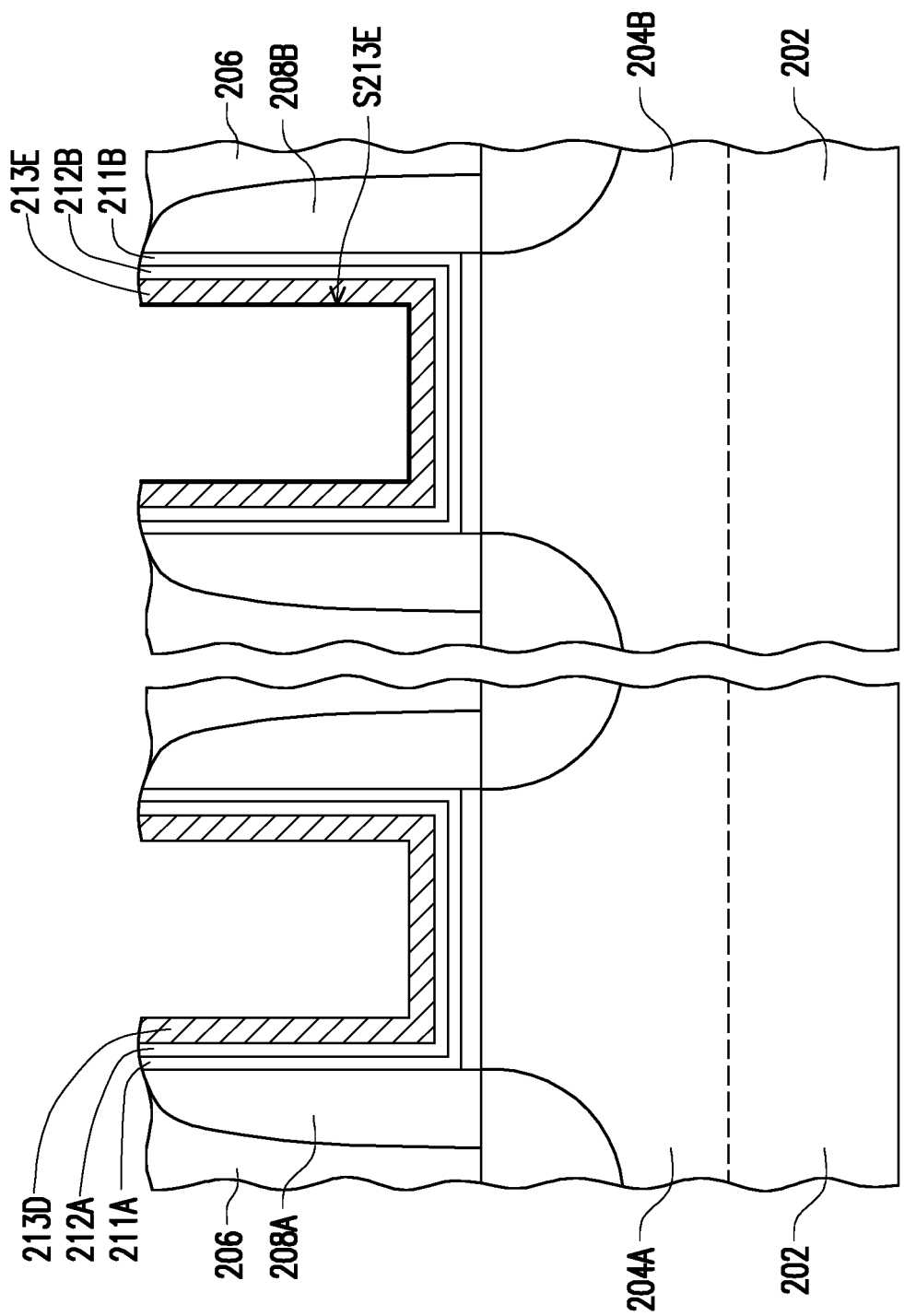

Subsequently, the hard mask layer 220 may be removed and the structure as shown in FIG. 11 is achieved. Now, the exposed work function setting layer that was previously covered by the hard mask layer 230 is indicated as the work function setting layer 213D and the treated work function setting layer is indicated as the work function setting layer 213E. The work function setting layer 213E is treated by the surface treatment ST shown in FIG. 10 to have an interface surface S213E. The material of the interface surface S213E may be different from the material of the bulk of the work function setting layer 213E. For example, the material of the interface surface S213E may include halogen material such as F, Cl, Br, or the like, or a combination thereof while the material of the bulk of the work function setting layer 213E may not include halogen material. In addition, the work function setting layer 213D, now exposed and previously covered by the hard mask layer 220, neither includes halogen material.

Figure 12:
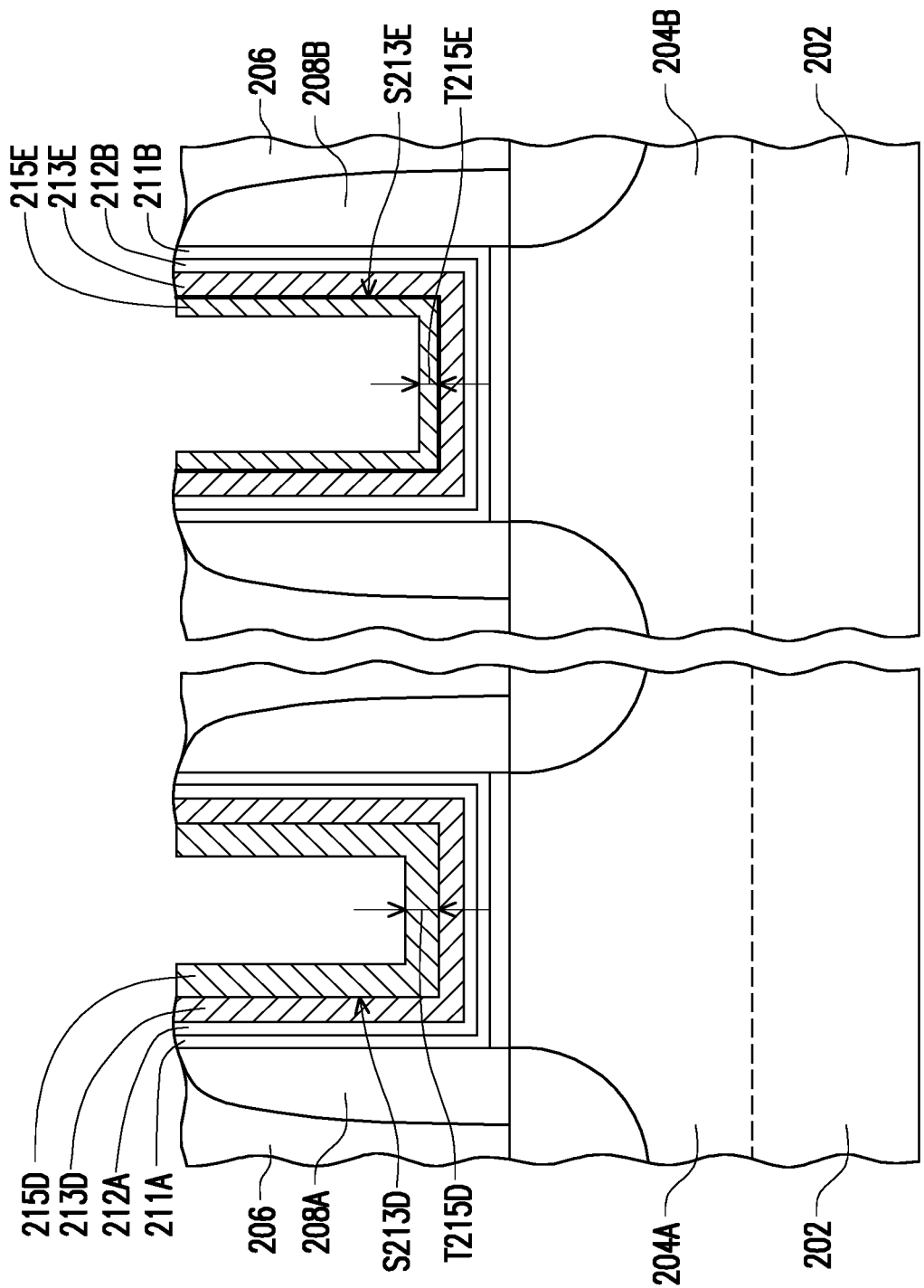

Thereafter, as shown in FIG. 12, a deposition process of work function metal material is performed to form a work function tuning layer 215D on the work function setting layer 213D and a work function tuning layer 215E on the work function setting layer 213E. The interface surface S213D between the work function setting layer 213D and the work function tuning layer 215D is not subjected to the surface treatment and the interface surface S213E between the work function setting layer 213E and the work function tuning layer 215E has been subjected to the surface treatment so that the surface property of the interface surface S213E may be different from that of the interface surface S213D, which may cause various deposition results. For example, the growth rate of the work function metal material on the interface surface S213D is smaller than the growth rate of the work function metal material on the interface surface S213E that is treated by halogen material. Thus, the thickness T215D of the work function tuning layer 215D may be greater than the thickness T215E of the work function tuning layer 215E though the work function tuning layer 215D and the work function tuning layer 215E are formed under the same deposition process and the same deposition time.

Figure 13:
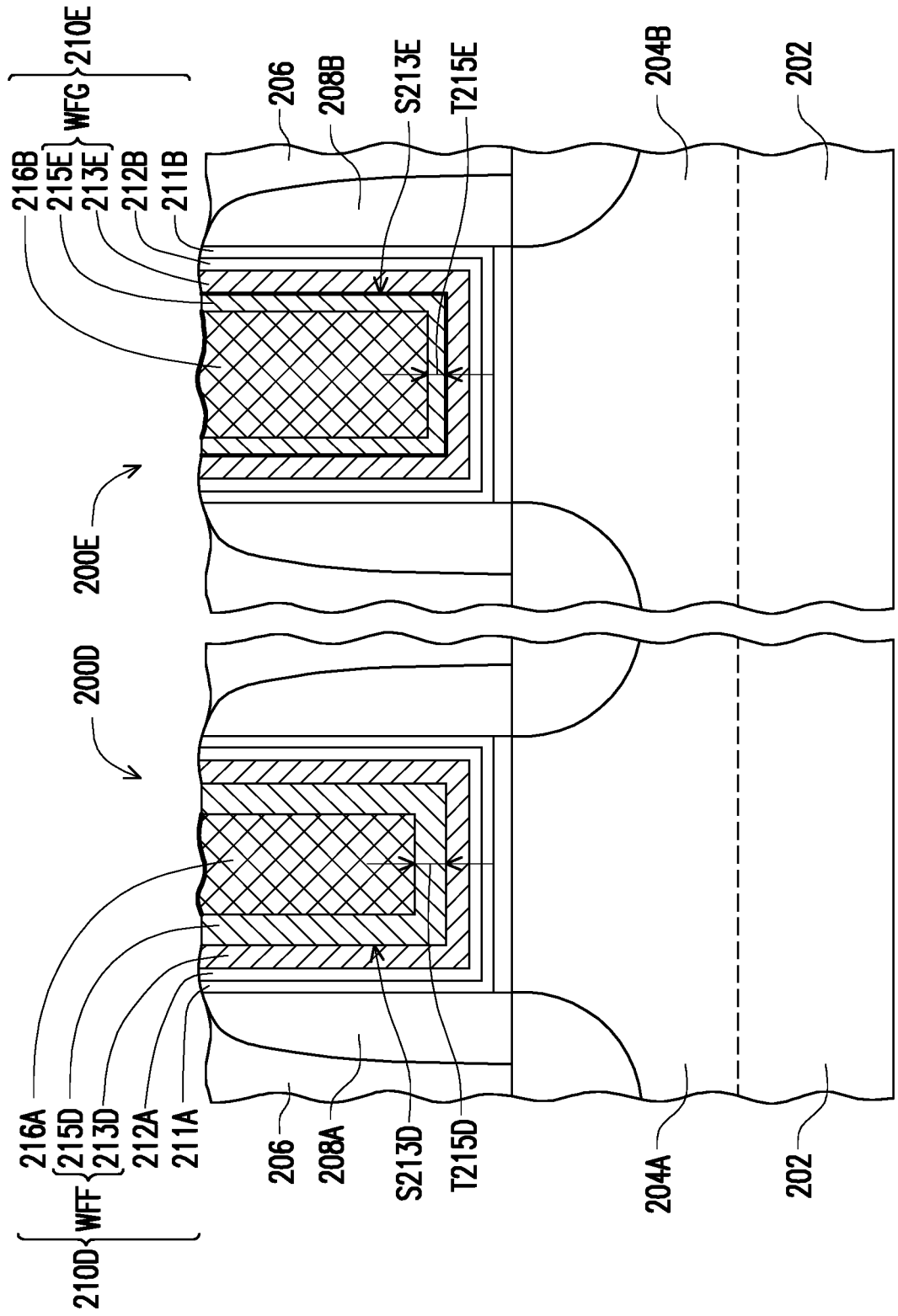

In FIG. 13, a gate electrode metal is deposited on the substrate 202 to form a gate electrode metal layer 216A and a gate electrode metal layer 216B. The gate electrode metal may include a gate fill material such as W, TiN, TaN, WN, Re, Ir, Ru, Mo, Al, Cu, Co, Ni, combinations thereof, and/or other suitable compositions. The gate electrode metal layer 216A fills the U-shape structure of the work function tuning layer 215D and the gate electrode metal layer 216B fills the U-shape structure of the work function tuning layer 215E to form a transistor 200D and a transistor 200E of a semiconductor device on the substrate 202.

The transistor 200D may include a gate structure 210D on the semiconductor fin 204A and the transistor 200E may include a gate structure 210E on the semiconductor fin 204B. In some embodiments, the gate structure 210D and the gate structure 210E may have a similar stacking structure, but may provide different work function values so that the threshold voltage of the transistor 200D may be different from that of the transistor 200E. For example, the gate structure 210D includes the stacking structure of the high-K dielectric layer 211A, the capping layer 212A, the work function setting layer 213D, the work function tuning layer 215D and the gate electrode metal layer 216A. Similarly, the gate structure 210E includes the stacking structure of the high-K dielectric layer 211B, the capping layer 212B, the work function setting layer 213E, the work function tuning layer 215E and the gate electrode metal layer 216B. Therefore, the stacking structure of the gate structure 210D is similar to that of the gate structure 210E.

Nevertheless, according to the above fabrication method, the gate structure 210D may have a work function stack WFF that is different from a work function stack WFG of the gate structure 210E. The work function stack WFF includes the work function setting layer 213D and the work function tuning layer 215D. The interface surface S213D of the work function setting layer 213D is not subjected to the surface treatment so that the material of the interface surface S213D of the work function setting layer 213D is the same as the material of the bulk of the work function setting layer 213D. The work function stack WFG includes the work function setting layer 213E and the work function tuning layer 215E. The interface surface S213E of the work function setting layer 213E have been subjected to the surface treatment, so that the material of the interface surface S213E may be different from the material of the bulk of the work function setting layer 213E. In addition, the thickness T215D of the work function tuning layer 215D may be thicker than the thickness T215E of the work function tuning layer 215E. Therefore, the resulted work function value of the work function stack WFF may be different from the resulted work function value of the work function stack WFG so that the threshold voltage of the transistor 200D may differ from the threshold voltage of the transistor 200E to achieve the multiple Vth design.

In view of the above, the semiconductor device in accordance with some embodiments of the disclosure include the gate structure having an ultra-thin modifying layer between the work function setting layer and the work function tuning layer so that the electric property, such as the threshold voltage, of the transistor may be modified. Accordingly to some embodiments, the interface surface that the work function tuning layer is in contact with is treated by halogen material so that the work function tuning layer may have a different thickness from the work function tuning layer formed on the non-treated surface. Accordingly, the semiconductor device may adopt one or more of the designs of the embodiments to achieve the multiple threshold voltage design.

In accordance with some embodiments, a semiconductor device including a gate structure disposed on a substrate is provided. The gate structure includes a work function setting layer and a work function tuning layer sequentially disposed on substrate. The work function tuning layer is in contact with an interface surface positioned between the work function setting layer and the work function tuning layer, and a material of the interface surface is different from the work function setting layer.

In accordance with some embodiments, a semiconductor device including a gate structure disposed on a substrate is provided. The gate structure includes a work function setting layer, a modifying layer and a tuning work function layer sequentially disposed on the substrate, and the modifying layer is made of an insulation material.

In accordance with some embodiments, a method of fabricating semiconductor device is provided. A first work function setting layer and a second work function setting layer is formed on a substrate. An insulation layer is formed on the substrate, wherein the insulation layer covers the first work function setting layer and exposes the second work function setting layer. A first work function tuning layer on the first work function setting layer and a second work function tuning layer on the second work function setting layer are formed by using a same deposition process. The first work function tuning layer is deposited on a first interface surface, the second work function tuning layer is deposited on a second interface surface, and a material of the first interface surface is different from a material of the second interface surface.

In accordance with some embodiments, the material of the interface surface includes halogen material. The work function tuning layer is immediately disposed on the work function setting layer with the interface surface therebetween. The gate structure further includes a modifying layer interposed between the work function setting layer and the work function tuning layer. The work function tuning layer is disposed on the modifying layer with the interface surface therebetween. A thickness of the modifying layer is greater than 0 Å and smaller than 10 Å. A material of the modifying layer comprises an insulation material. A material of the work function setting layer is different from a material of the work function tuning layer.

In accordance with some embodiments, a material of the modifying layer includes metal oxide or metal nitride. A thickness of the modifying layer is greater than 0 Å and smaller than 10 Å. An interface surface of the modifying layer in contact with the work function tuning layer includes halogen material. The work function setting layer and the tuning work function layer are of different work function materials.

In accordance with some embodiments, a surface treatment is further performed on the substrate prior to the forming the first work function tuning layer and the second work function tuning layer. The insulation layer is modified by the surface treatment to form a modifying layer having the first interface surface. The first work function setting layer is covered by the insulation layer during the surface treatment and the second work function setting layer is modified by the surface treatment to form the second interface surface. The insulation layer is removed after the surface treatment and prior to the forming the first work function tuning layer and the second wok function tuning layer. The surface treatment includes a halogen plasma treatment. The insulation layer is interposed between the first work function setting layer and the first work function tuning layer as a modifying layer having the first interface surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating semiconductor device, comprising:
    forming a first work function setting layer of a first transistor and a second work function setting layer of a second transistor on a substrate;
    forming an insulation layer on the substrate, wherein the insulation layer covers the first work function setting layer and exposes the second work function setting layer; and
    forming a first work function tuning layer of the first transistor on the first work function setting layer and forming a second work function tuning layer of the second transistor on the second work function setting layer using a same deposition process, wherein a growth rate of the first work function tuning layer is different from a growth rate of the first work function tuning layer, the first work function tuning layer is formed to have a thickness different from the second work function tuning layer in the same deposition process, the first work function tuning layer is deposited on a first interface surface, the second work function tuning layer is deposited on a second interface surface, and a material of the first interface surface is different from a material of the second interface surface.

2. The method according to claim 1, further performing a surface treatment on the substrate prior to the forming the first work function tuning layer and the second work function tuning layer.

3. The method according to claim 2, wherein the insulation layer is modified by the surface treatment to form a modifying layer having the first interface surface.

4. The method according to claim 2, wherein the first work function setting layer is covered by the insulation layer during the surface treatment and the second work function setting layer is modified by the surface treatment to form the second interface surface.

5. The method according to claim 4, wherein the insulation layer is removed after the surface treatment and prior to the forming the first work function tuning layer and the second wok function tuning layer.

6. The method according to claim 2, wherein the surface treatment comprises a halogen plasma treatment.

7. The method according to claim 1, wherein the insulation layer is interposed between the first work function setting layer and the first work function tuning layer as a modifying layer having the first interface surface.

8. A method of fabricating semiconductor device, comprising:
    forming a first work function setting layer of a first transistor and a second work function setting layer of a second transistor on a substrate;
    forming an insulation layer on the substrate, wherein the insulation layer covers the first work function setting layer and exposes the second work function setting layer; and
    forming a first work function tuning layer of the first transistor on the first work function setting layer and forming a second work function tuning layer of the second transistor on the second work function setting layer using a same deposition process, wherein a growth rate of the first work function tuning layer is different from a growth rate of the first work function tuning layer, the first work function tuning layer is deposited on a first interface surface, the second work function tuning layer is deposited on a second interface surface, and a material of the first interface surface is different from a material of the second interface surface.

9. The method according to claim 8, further performing a surface treatment on the substrate prior to the forming the first work function tuning layer and the second work function tuning layer.

10. The method according to claim 9, wherein the insulation layer is modified by the surface treatment to form a modifying layer having the first interface surface.

11. The method according to claim 9, wherein the first work function setting layer is covered by the insulation layer during the surface treatment and the second work function setting layer is modified by the surface treatment to form the second interface surface.

12. The method according to claim 11, wherein the insulation layer is removed after the surface treatment and prior to the forming the first work function tuning layer and the second wok function tuning layer.

13. The method according to claim 9, wherein the surface treatment comprises a halogen plasma treatment.

14. The method according to claim 8, wherein the insulation layer is interposed between the first work function setting layer and the first work function tuning layer as a modifying layer having the first interface surface.

15. A method of fabricating semiconductor device, comprising:
    forming a first work function setting layer of a first transistor and a second work function setting layer of a second transistor on a substrate;
    forming an insulation layer on the substrate, wherein the insulation layer covers the first work function setting layer and exposes the second work function setting layer; and
    forming a first work function tuning layer of the first transistor on the first work function setting layer and forming a second work function tuning layer of the second transistor on the second work function setting layer using a same deposition process, wherein a growth rate of the first work function tuning layer is different from a growth rate of the first work function tuning layer, the first work function tuning layer is formed to have a thickness different from the second work function tuning layer in the same deposition process, the first work function tuning layer is deposited on a first interface surface, the second work function tuning layer is deposited on a second interface surface, and a material of the first interface surface is different from a material of the second interface surface, different from a material of the first work function setting layer and different from a material of the first work function tuning layer.

16. The method according to claim 15, further performing a surface treatment on the substrate prior to the forming the first work function tuning layer and the second work function tuning layer.

17. The method according to claim 16, wherein the insulation layer is modified by the surface treatment to form a modifying layer having the first interface surface.

18. The method according to claim 16, wherein the first work function setting layer is covered by the insulation layer during the surface treatment and the second work function setting layer is modified by the surface treatment to form the second interface surface.

19. The method according to claim 18, wherein the insulation layer is removed after the surface treatment and prior to the forming the first work function tuning layer and the second wok function tuning layer.

20. The method according to claim 16, wherein the surface treatment comprises a halogen plasma treatment.

\* \* \* \* \*